(12) United States Patent
Pekny

(10) Patent No.: US 9,858,971 B2
(45) Date of Patent: *Jan. 2, 2018

(54) APPARATUSES INCLUDING MULTIPLE READ MODES AND METHODS FOR SAME

(71) Applicant: MICRON TECHNOLOGY, INC., Boise, ID (US)

(72) Inventor: Theodore T. Pekny, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/439,507

(22) Filed: Feb. 22, 2017

(65) Prior Publication Data

US 2017/0162241 A1 Jun. 8, 2017

Related U.S. Application Data

(63) Continuation of application No. 14/846,510, filed on Sep. 4, 2015, now Pat. No. 9,583,160.

(51) Int. Cl.
*G11C 7/12* (2006.01)

(52) U.S. Cl.
CPC ..................... *G11C 7/12* (2013.01)

(58) Field of Classification Search
USPC ........................................................ 365/191
See application file for complete search history.

(56) References Cited

U.S. PATENT DOCUMENTS

| 7,949,818 | B2* | 5/2011 | Suyama | G11C 16/26 711/103 |
|---|---|---|---|---|
| 9,583,160 | B1* | 2/2017 | Pekny | G11C 7/22 |
| 9,607,705 | B1 | 3/2017 | Tanzawa | |
| 2007/0091703 | A1 | 4/2007 | Nishimura et al. | |
| 2008/0049505 | A1 | 2/2008 | Kim et al. | |
| 2008/0175081 | A1 | 7/2008 | Kim et al. | |
| 2008/0291762 | A1 | 11/2008 | Kajigaya | |
| 2010/0128539 | A1 | 5/2010 | Kobayashi et al. | |

(Continued)

OTHER PUBLICATIONS

U.S. Appl. No. 14/846,510, entitled Apparatuses Including Multiple Read Modes and Methods for Same, filed Sep. 4, 2015, pp. all.

(Continued)

*Primary Examiner* — Hoai V Ho
*Assistant Examiner* — Minh Dinh
(74) *Attorney, Agent, or Firm* — Dorsey & Whitney LLP

(57) ABSTRACT

Apparatuses and methods including multiple read modes for reading data from a memory are described. An example apparatus includes a memory including a first read mode and a second read mode. The memory has a read operation for the first read mode including a first pre-access phase, an access phase, and a first post-access phase. The read operation for the second read mode includes a second pre-access phase, the access phase, and a second post-access phase. The read operation for either the first read mode or the second read mode is performed responsive to the memory receiving a read command. The second pre-access phase is different from the first pre-access phase, with the second pre-access phase having a shorter time than the first pre-access phase measured from receipt of the read command.

20 Claims, 5 Drawing Sheets

(56) References Cited

U.S. PATENT DOCUMENTS

| | | |
|---|---|---|
| 2011/0149663 A1 | 6/2011 | Yoshida |
| 2011/0220968 A1 | 9/2011 | Takayama et al. |
| 2012/0127816 A1 | 5/2012 | Kajigaya et al. |
| 2012/0213016 A1 | 8/2012 | Iida |
| 2012/0218837 A1* | 8/2012 | Dimartino ............... G05F 1/575 365/189.011 |
| 2014/0372678 A1* | 12/2014 | Moon ................. G06F 12/0246 711/103 |
| 2015/0325288 A1 | 11/2015 | Balluchi et al. |
| 2016/0062656 A1 | 3/2016 | Ramaraju et al. |
| 2017/0069362 A1 | 3/2017 | Pekny |
| 2017/0069392 A1 | 3/2017 | Tanzawa |
| 2017/0178732 A1 | 6/2017 | Tanzawa |

OTHER PUBLICATIONS

U.S. Appl. No. 14/846,549, entitled Apparatuses and Methods for Charging a Global Access Line Prior to Accessing a Memory, filed Sep. 4, 2015, pp. all.

Iwata, et al., "A High-Density NAND EEPROM with Block-Page Programming for Microcomputer Applications", IEEE Journal of Solid-State Circuits, vol. 25, No. 2, Apr. 1990, 417-424.

* cited by examiner

APPARATUSES INCLUDING MULTIPLE READ MODES AND METHODS FOR SAME

CROSS-REFERENCE TO RELATED APPLICATION

This application is a continuation of pending U. S. patent application No. 14/846,510, filed Sep. 4, 2015 and issued as U. S. Pat. No. 9,583,160 on Feb. 28, 2017. The aforementioned application and now issued patent is incorporated by reference herein in its entirety and for all purposes.

BACKGROUND

Access times of electronic memory can affect performance of an overall electronic system including the electronic memory, and as such, it is generally desirable to reduce memory access time in order to improve system performance. Access time generally refers to the time from when a memory access command is received by a memory to when data is made available by the memory.

With conventional non-volatile memory, such as NAND flash memory, memory access operations involve various operations that may take time to perform. Examples of these various operations may include activating charge pump circuits to develop pumped voltages used during the access operation and calculation of temperature compensation information. Additionally, the memory associated with the access operation may be accessed, the stored data sensed, and in preparation for a subsequent memory operation, the circuits used during the memory access operation restored to a condition that existed prior to beginning the memory access operation. The data read is made available for output by the memory following the circuits being restored to the initial condition.

The various operations add to the overall access time of the non-volatile memory, and memory performance may be improved by reducing the time of one or more of the various operations.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1A:
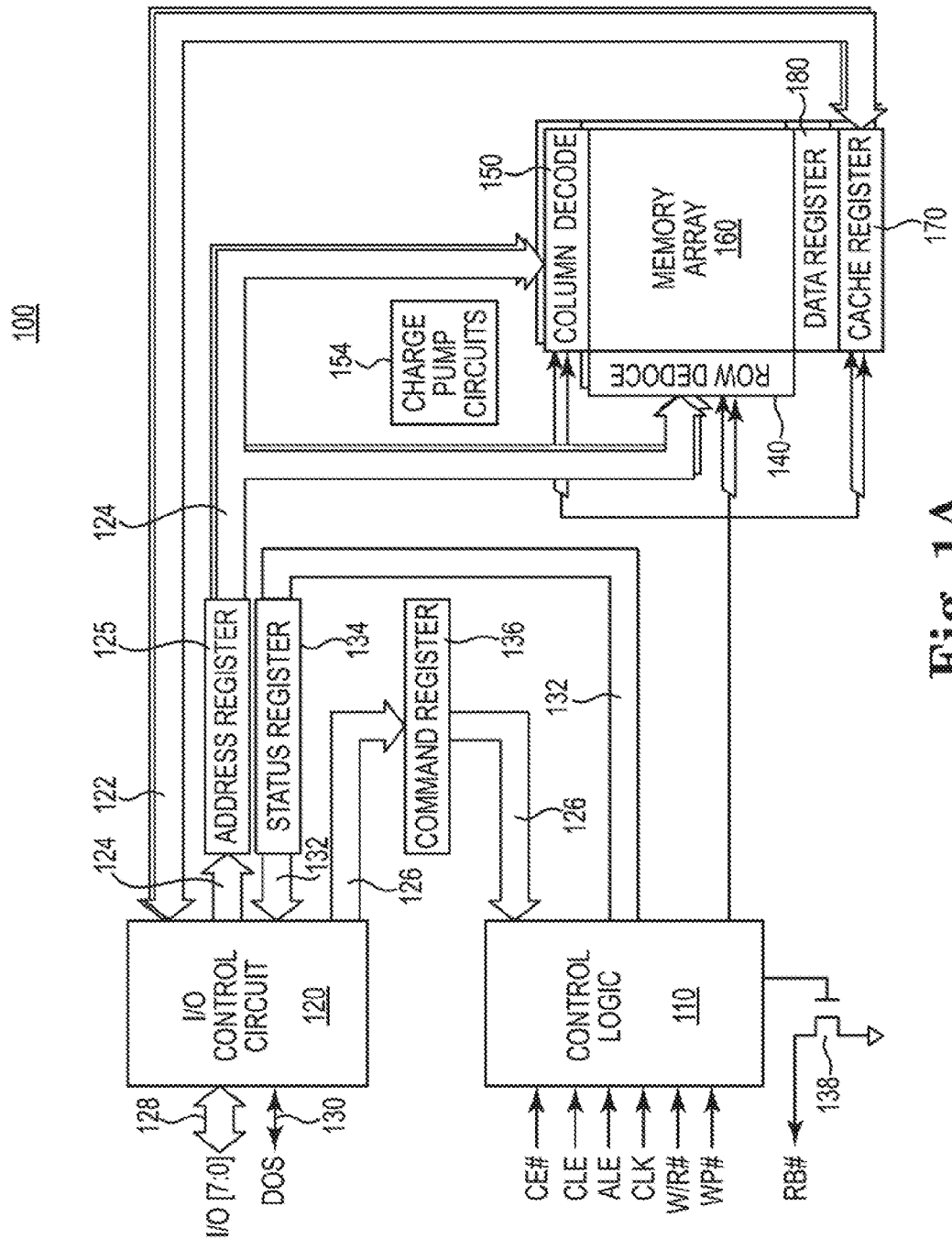
FIG. 1A is a block diagram of a memory according to an embodiment of the invention.

FIG. 1A illustrates an apparatus that includes a memory 100 according to an embodiment of the invention. The memory 100 includes a memory array 160 with a plurality of memory cells that are configured to store data. The memory cells may be accessed in the array through the use of various signal lines, for example, global word lines (GWLs), local word lines (LWLs), and bitlines (BLs). The memory cells may be non-volatile memory cells, such as NAND or NOR flash cells, phase change memory cells, or may generally be any type of memory cells. The memory cells may be single level cells configured to store data for one bit of data. The memory cells may also be multi-level cells configured to store data for more than one bit of data.

Commands, address information, and write data may be provided to the memory 100 as sets of sequential input/output (I/O) transmitted through an I/O bus 128. Similarly, read data may be provided from the memory 100 through the I/O bus 128. A data strobe signal DQS may be transmitted through a data strobe bus 130. The DQS signal may be used to provide timing information for the transfer of data to the memory or from the memory. The I/O bus 128 is connected to an I/O control circuit 120 that routes data signals, address information signals, and other signals between the I/O bus 128 and an internal data bus 122, an internal address bus 124, and an internal command bus 126. An address register 125 may be provided address information by the I/O control circuit 120 to be temporarily stored. The I/O control circuit 120 is coupled to a status register 134 through a status register bus 132. Status bits stored by the status register 134 may be provided by the I/O control circuit 120 responsive to a read status command provided to the memory 100. The status bits may have respective values to indicate a status condition of various aspects of the memory and its operation.

The memory 100 also includes a control logic 110 that receives a number of control signals either externally (e.g., CE#, CLE, ALE, CLK, WIR#, and WP#) or through the command bus 126 to control the operation of the memory 100. A command register 136 is coupled to the internal command bus 126 to store information received by the L/O control circuit 120 and provide the information to the control logic 110. The control logic 110 may further access a status register 134 through the status register bus 132, for example, to update the status bits as status conditions change. The control logic 110 is further coupled to a ready/busy circuit 138 to control a value (e.g., logic value) of a ready/busy signal R/B# that may be provided by the memory 100 to indicate whether the memory is ready for an operation or is busy. The control logic 110 may be configured to provide internal control signals to various circuits of the memory 100. For example, responsive to receiving a memory access command (e.g., read, write, program), the control logic 110 may provide internal control signals to control various memory access circuits to perform a memory access operation. The various memory access circuits are used during the memory access operation, and may generally include circuits such as row and column decoders, charge pump circuits, signal line drivers, data and cache registers, I/O circuits, as well as others.

The address register 125 provides block-row address signals to a row decoder 140 and column address signals to a column decoder 150. The row decoder 140 and column decoder 150 may be used to select blocks of memory cells for memory operations, for example, read, program, and erase operations. The row decoder 140 and/or the column decoder 150 may include one or more signal line drivers configured to provide a biasing signal to one or more of the signal lines in the memory array 160. The signal line drivers may drive the signal lines with a pumped voltage that is provided by charge pump circuits 154. The charge pump circuits 154 may provide different voltages used during operation of the memory 100, for example, during memory access operations. The voltages provided by the charge pump circuits 154 may include voltages that are greater than a power supply voltage provided to the memory 100, voltages that are less than a reference voltage (e.g., ground) provided to the memory 100, as well as other voltages as well.

Figure 1B:
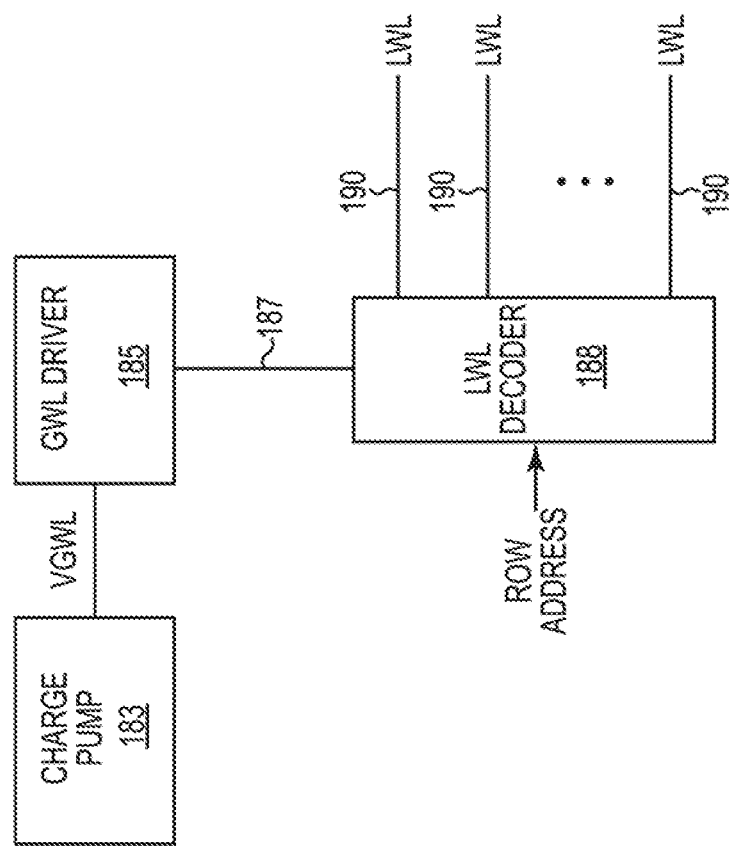
FIG. 1B is a block diagram of a portion of the memory of FIG. 1A.

FIG. 1B illustrates a portion of the memory 100, in particular, an arrangement of a global word line GWL driver 185, a GWL 187, a local word line decoder 188, and LWLs 190. A charge pump circuit 183, for example, included in charge pump circuits 154, is coupled to provide a GWL voltage VGWL to the GWL driver 185. In some embodiments, the GWL driver 185 and the local word line decoder 188 are included in the row decoder 140. The GWL 187 (as well as other GWLs) and the LWLs 190 may extend through the memory array 160, and as previously discussed, may be used to access the memory cells of the memory array 160. During a memory access operation, the charge pump circuit 183 provides the VGWL voltage to the GWL driver 185, which is configured to drive the GWL 187 with the VGWL voltage. The GWL 187 provides the VGWL voltage to the LWL decoder 188, which, based on row address signals, transfers the voltage of the GWL 187 to one or more of the LWLs 190 associated with the memory address of the memory access operation. It will be appreciated while FIG. 1B illustrates one GWL driver, one GWL, one LWL decoder and a plurality of LWLs that the memory 100 may include additional GWL drivers, GWLs, LWL decoders, and LWLs.

For a program operation, after the row address signals have been applied to the address bus 124, the I/O control circuit 120 routes write data signals to a cache register 170. The write data signals are stored in the cache register 170 in successive sets each having a size corresponding to the width of the I/O bus 128. The cache register 170 sequentially stores the sets of write data signals for an entire row or page of memory cells in the array 160. All of the stored write data signals are then used to program a row or page of memory cells in the array 160 selected by the block-row address coupled through the address bus 124. In a similar manner, during a read operation, data signals from a row or block of memory cells selected by the block-row address coupled through the address bus 124 are stored in a data register 180. The data register 180 and the cache register 170 may act as a single register for some page operations. For example, data stored in the data register 180 may be also stored in the cache register 170. Sets of data signals corresponding in size to the width of the I/O bus 128 are then sequentially transferred through the I/O control circuit 120 from the data register 180 and/or the cache register 170 to the I/O bus 128.

The memory 100 is configured to have a first read mode and a second read mode. A particular read mode of the memory 100 may be enabled following power up of the memory, or during operation of the memory. In some embodiments, a read mode may be enabled using a set feature operation. The memory 100 includes a set feature operation that may allow various features to be enabled. A feature may be enabled by issuing a set feature command to the memory, and providing a feature address for the feature to be enabled. The features may further have subfeatures that may be enabled by providing subfeature parameters. The subfeature parameters may be provided to the memory as data.

Figure 2:
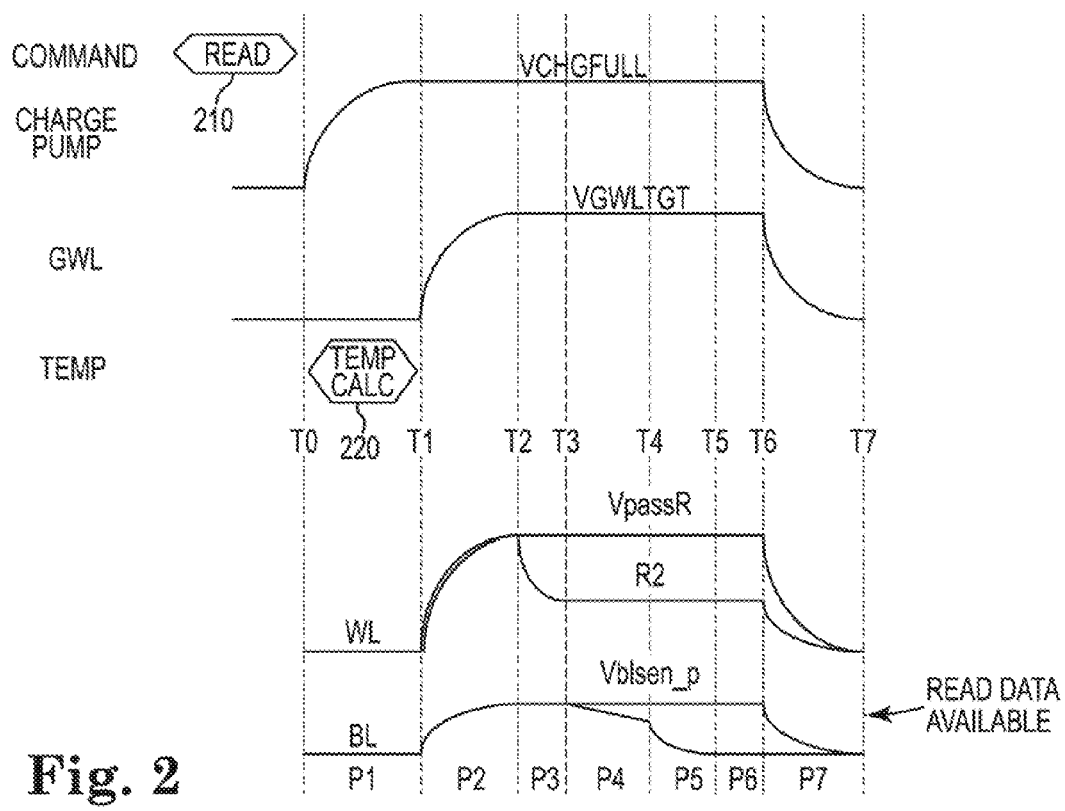
FIG. 2 is a timing diagram of various signal levels during a read operation for a first read mode according to an embodiment of the invention.

FIG. 2 illustrates a timing diagram of a read operation for a first read mode according to an embodiment of the invention. The read operation for the first read mode may be performed responsive to a read command received by the memory.

Responsive to a read command 210 received prior to time T0, during a time period P1 between times T0 and T1, one or more charge pump circuits of the memory are activated and begin to develop respective pumped voltages that are used during the read operation. For example, a charge pump circuit may be configured to develop a full pumped voltage VCHGFULL that will be provided to a GWL driver to drive the GWLs associated with a memory address of the read command to a target GWL voltage VGWLTGT in a later time period. The voltage of the GWLs associated with the memory address of the read command is not shown in FIG. 2. Other charge pump circuits may develop respective pumped voltages also used during the read operation. The activation of circuits used during a read operation, such as charge pump circuits included in charge pump circuits 154 (FIG. 1A), may represent a sub-operation of the read operation. In some embodiments, temperature compensation information is calculated during the time period P1, for example, by the control logic 110 (FIG. 1A). Calculation of temperature compensation information is represented in FIG. 2 as TEMP CALC 220 during time period P1. The temperature compensation information may be based on a temperature measurement taken by a temperature sensor in the memory, and used to adjust voltage levels of various internal voltages used during the read operation. The temperature compensation information may include, for example, temperature coefficients which are used to adjust voltage levels. Calculation of temperature compensation information may be considered another sub-operation of the read operation. Additional circuits may be activated during the time period P1 as well to prepare conditions for the read operation. The time period P1 may be generally referenced as a pre-access phase.

During a time period P2 between times T1 and T2, the GWLs are driven to the target GWL voltage VGWLTGT. The GWLs may be driven, for example, by GWL drivers providing a full pumped voltage to the GWLs. The voltage of one or more of the GWLs may be transferred to LWLs associated with the memory address of the read command through an associated LWL decoder. The LWLs associated with the memory address of the read command may be driven to a target LWL voltage during the time period P2. The target LWL voltage is shown in FIG. 2 as VpassR. FIG. 2 illustrates two LWLs driven to the target LWL voltage. As will be described in more detail below, one of the LWLs represents a selected LWL associated with the read command having a voltage that will change in the follow time period P3, and the other LWL represents an example unselected LWL having a voltage that will remain at the VpassR voltage. BLs may also be precharged to a precharge voltage for the read operation. The BL precharge voltage is shown in FIG. 2 at Vblsen_p.

During a time period P3 between times T2 and T3, a selected LWL associated with the memory address of the read command changes to a read LWL voltage, shown in FIG. 2 as R2. An unselected LWL remains at the VpassR voltage. Following the time period P3, during a time period P4 between times T3 and T4, the data states of the memory cells coupled to the selected LWL are provided to respective BLs, and are then amplified during time period P5 between times T4 and T5. The data states may be amplified by sense amplifiers coupled to the BLs. During time period P6 between times T5 and T6, the amplified data states of the memory cells are sensed from the respective BLs to determine the data states of the memory cells. The data is then provided to the data register. The time periods P2-P6 may collectively be generally referenced as an access phase.

During a time period P7 between times T6 and T7, the GWLs, LWLs and BLs are discharged to an initial condition, and charge pump circuits are also deactivated and discharged to an initial condition in preparation for a subsequent memory operation. Returning various circuits and signal lines to initial conditions may be considered a sub-operation of the read operation. The time period following P6 may be generally referenced as a post-access phase. Following the time period P7 during which various circuits and signal lines used during the read operation are returned to the initial conditions, the read data read during the read operation may be provided by the memory.

Figure 3:
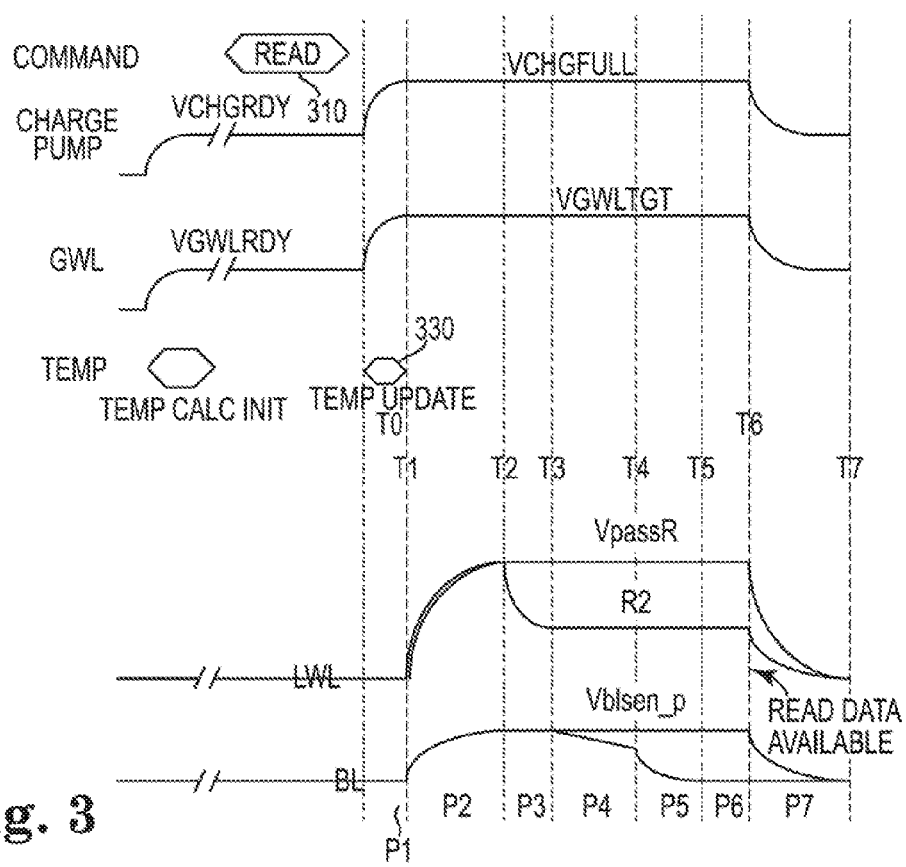
FIG. 3 is a timing diagram of various signal levels during a read operation for a second read mode according to an embodiment of the invention.

FIG. 3 illustrates a timing diagram for a second read mode according to an embodiment of the invention.

Prior to the memory receiving a read command 310, various circuits and signal lines used during a read operation are put into a ready condition. Placing the various circuits and signal lines into a ready condition may represent a sub-operation of the read operation. For a read operation for the second read mode, the ready condition may represent an initial condition for the various circuits and signal lines. For example, one or more of the charge pump circuits that provide pumped voltages used during the read operation may be activated to develop respective ready pumped voltages in preparation for a read operation. In some embodiments, the ready pumped voltage may be less than the full pumped voltages developed by the activated charge pump circuits during a read operation, but greater than an inactive voltage for the charge pump circuits. An example is illustrated in FIG. 3 with a charge pump circuit developing a ready pumped voltage VCHGRDY prior to the read command 310. The ready pumped voltage VCHGRDY is less than the full pumped voltage VCHGFULL. The ready pumped voltage may be equal to the full pumped voltages in other embodiments. Additionally, one or more of the signal lines used during a read operation may be precharged to a ready signal line voltage. For example, the GWLs may be precharged to a ready GWL voltage. In some embodiments, the ready GWL voltage may be less than the target GWL voltage used during a read operation. An example is illustrated in FIG. 3 with the GWL being precharged to a ready GWL voltage VGWLRDY that is less than a target GWL voltage VGWLTGT. The ready GWL voltage may be equal to the target GWL voltage in other embodiments.

Also prior to receiving a read command while in the second read mode, temperature compensation information may be calculated, for example, by the control logic 110. Calculating the temperature compensation information may be considered a sub-operation of the read operation. Calculation of temperature compensation information is represented in FIG. 3 as TEMP CALC INIT 320 prior to the read command 310. In some embodiments, the TEMP CALC INIT 320 operation is different than the TEMP CALC operation of a first read mode (e.g., with reference to FIG. 2). For example, the operation may be shorter than the TEMP CALC operation of the first read mode, due to a less involved temperature compensation information calculation. In other embodiments, the TEMP CALC INIT 320 operation may be the same as the TEMP CALC operation of the first read mode, but performed prior to receiving a read command. As previously discussed, the temperature compensation information may be used to adjust voltage levels of various internal voltages used during the read operation to compensate for temperature variation. At the time a read operation is performed, the temperature compensation information may be updated based on the temperature at that time and adjustments made if necessary. For example, where the temperature at the time a read operation is performed is within an temperature range of the temperature at which the temperature compensation information was calculated, new temperature compensation information is not needed. However, where the temperature at the time a read operation is performed exceeds the temperature range, new temperature compensation information may be calculated. In some embodiments, the temperature compensation information for various different temperatures may be calculated and stored to then be accessed upon receiving a read command and initiates the read operation. Storing the temperature compensation information may provide quick access to temperature compensation information when a read operation is to be performed.

By way of example, prior to receiving a read command while in the second read mode, the charge pump circuits for providing a pumped voltage for driving the GWL may be activated to develop a ready pumped voltage. The GWLs may also be precharged to a ready GWL voltage, such as by driving the GWLs with a GWL driver using the ready pumped voltage. Also, as previously discussed, temperature compensation information for temperature compensation may be calculated in preparation for a read operation.

With reference to FIG. 3, prior to time T0, the read command 310 is provided, and at time T0, a read operation is initiated, for example, responsive to the received read command 310. During the time period Pt between times T0 and T1, any remaining charge pump circuits needed for the read operation that were not previously activated are now activated to develop the pumped voltages. Previously activated charge pump circuits which had developed respective ready pumped voltages VCHGRDY (e.g., less than full pumped voltages) are controlled to develop the full pumped voltages VCHGFULL. GWLs are also driven from the ready GWL voltage VGWLRDY to the target GWL voltage VGWLTGT during time period P1, such as by GWL drivers providing the full pumped voltage from a charge pump circuit. The time period P1 may be generally referenced as a pre-access phase.

Temperature compensation information may be updated during the time period P1. Updating of the temperature compensation information is represented in FIG. 3 as TEMP UPDATE 330 during the time period P1. For example, the temperature at the time of the read operation may be measured, and evaluated to determine whether the temperature compensation information calculated prior to receiving a read command should be updated. The temperature compensation information may be updated when the current temperature exceeds a range relative to the temperature at the time the temperature compensation information was calculated prior to receiving a read command. In embodiments where temperature compensation information for various temperatures is stored, the temperature at the time of the read operation may be measured, and the corresponding stored temperature compensation information may be retrieved and used for temperature compensation.

The time period P1 for a read operation for the second read mode is shorter than the time period P1 for a read operation for the first read mode, as previously described with reference to FIG. 2. Due to the GWLs being precharged to a ready GWL voltage VGWLRDY prior to receiving a read command, the time for driving the GWLs to the target GWL voltage VGWLTGT is shortened compared to the time needed during time period P1 for a read operation for the first read mode (e.g., previously described with reference to FIG. 2). Additionally, due to calculating temperature compensation information prior to receiving a read command, confirming and updating of the temperature compensation information for the read operation may take less time than calculating temperature compensation information at the time a read operation is performed (such as during time period P1 for the first read operation previously described with reference to FIG. 2).

Returning to FIG. 3, during time period P2 between times T1 and T2, the GWLs are driven to a target GWL voltage VGWLTGT. The GWLs may be driven, for example, by GWL drivers providing a full pumped voltage VCHGFULL to the GWLs. LWLs associated with the memory address of the read command may also be driven to a target LWL voltage during the time period P2. The target LWL voltage is shown in FIG. 3 as VpassR. FIG. 3 illustrates two LWLs driven to the target LWL voltage. As will be described in more detail below, one of the LWLs represents a selected LWL associated with the read command having a voltage that will change in the follow time period P3, and the other LWL represents an example unselected LWL having a voltage that will remain at the VpassR voltage. BLs may also be precharged to a precharge voltage for the read operation. The BL precharge voltage is shown in FIG. 3 at Vblsen_p.

During a time period P3 between times T2 and T3, a selected LWL associated with the memory address of the read command changes to a read LWL voltage, shown in FIG. 3 as R2. An unselected LWL remains at the VpassR voltage. Following the time period P3, during a time period P4 between times T3 and T4, the data states of the memory cells coupled to the selected LWL are provided to respective BLs, and are then amplified during time period P5 between times T4 and T5. The data states may be amplified by sense amplifiers coupled to the BLs. During time period P6 between times T5 and T6, the amplified data states of the memory cells are sensed from the respective BLs to determine the data states of the memory cells. The data is then provided to a data register. The time periods P2-P6 may collectively be generally referenced as an access phase.

In contrast to a read operation for the first read mode, for a read operation for the second read mode the read data read during the read operation may be provided by the memory following the time period P6. As a result, the read data may be provided earlier in comparison to when read data may be provided for a read operation for the first read mode.

Also following the time period P6, during a time period P7 between times T6 and T7, the GWLs, LWLs and BLs are discharged to an initial condition, and charge pump circuits are returned to an initial condition in preparation for a subsequent memory operation. Returning various circuits and signal lines to an initial condition may be considered a sub-operation of the read operation. The time period following P6 may be generally referenced as a post-access phase. As previously discussed, when the second read mode is enabled, the initial condition may be a ready condition for various circuits and signal lines of the memory. For example, one or more of the charge pump circuits (e.g., a charge pump circuit for providing a drive voltage for GWLs) may remain activated to develop respective ready pumped voltages in preparation for a read operation. Additionally, one or more of the signal lines used during a read operation (e.g., GWLs) may be precharged to a ready signal line voltage.

Comparing the timing of a read operation for the first read mode with a read operation for the second read mode, the time from when a read operation is initiated (e.g., time T0) to when data may be provided is shorter for the read operation for the second read mode. As a result, data may be provided sooner for a read operation for the second read mode. Several of the sub-operations of the read operations for both the first and second read modes may be similar, such as the sub-operations between times T1 and T6 (with reference to FIGS. 2 and 3). Thus, while read data may be provided sooner for read operations for the second read mode, the quality of reading the data for the first and second read modes will be similar.

Time savings may be obtained toward the beginning of the read operation. For example, the time period P1 for a read operation for the second read mode may be shorter than the time period P1 for a read operation for the first read mode, in part, due to various circuits and signal lines being placed in a ready condition, as previously discussed. When a read operation is initiated, the time needed to fully charge circuits and signals lines may be shorter due to the ready condition of the circuits and signals, thus shortening the time for the sub-operation of activating circuits and preparing signal lines when a read operation is initiated. Additionally, time period P1 may be shorter because temperature compensation information may be calculated prior to initiating a read operation for the second read mode. After the read operation is initiated, the temperature compensation information may only need to be updated, or obtained from stored temperature compensation information, thus shortening the time for the sub-operation of calculating temperature compensation information when a read operation is initiated.

Time savings may also be obtained toward the end of the read operation. For example, for a read operation for the second read mode read data may be provided earlier than for a read operation for the first read mode. In particular, as previously discussed, read data may be provided by the memory in the second read mode before the sub-operation of returning circuits and signal lines used during the read operation to an initial condition. In contrast, read data may be provided by the memory in the first read mode after completion of the sub-operation of returning circuits and signal lines used during the read operation to an initial condition.

In some embodiments, various sub-operations of a read operation for the second read mode may be selected to be performed according to a read operation of the first read mode. For example, the sub-operation of calculating the temperature compensation information may be performed for the second read mode in the same manner as performed for the first read mode (e.g., calculating the temperature compensation information after the read operation is initiated). In another example, when selected for the second read mode, read data may be provided after the sub-operation of returning various circuits and signal lines used during the read operation are returned to an initial condition, as for the first read operation. In some embodiments, selection of the sub-operations may be made when enabling the second read mode using a set feature operation.

While FIGS. 2 and 3 illustrates the selected LWL changing to the read LWL voltage R2, in embodiments for read operations for multi-level memory cells several of the sub-operations may be repeated for different read LWL voltages.

For example, for a read operation for multi-level memory cells, sub-operations between times T2 and T6 may be repeated. A lower page read operation may be performed changing the selected LWL to a first read LWL voltage, and an upper page read operation may be performed changing the selected LWL to a second read LWL voltage, and then changed again to a third read LWL voltage, each time sensing the data state of the memory cells. It will be appreciated by those of ordinary skill in the art, however, that the time savings according to embodiments of the invention may be applied to read operations for both single level memory cells and for multi-level memory cells.

The read mode for a memory according to an embodiment of the invention may be enabled in the memory so that the read operations for an enabled read mode are performed responsive to a read command. A read mode may be enabled, for example, by a set feature operation. The set feature operation may be performed by the memory responsive to receiving a set feature command. In other embodiments, a read mode may be enabled in a different manner. For example, a read mode may be enabled by a test mode setting, a trim setting, an enable command, or using another manner.

Figure 4:
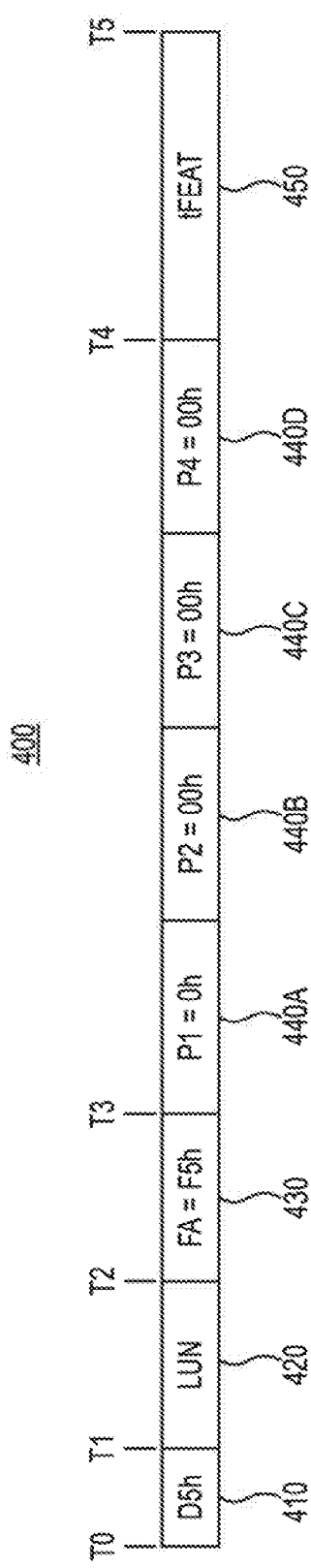
FIG. 4 is a diagram of a sequence for enabling a read mode using a set feature command according to an embodiment of the invention.

FIG. 4 illustrates a sequence 400 for enabling a read mode using a set feature command according to an embodiment of the invention. The sequence may be used with the memory 100 of FIG. 1A. In the example of FIG. 4, the second read mode is enabled by the set feature command.

At time T0, a SET FEATURE command 410 is received by the memory. In the example of FIG. 4, the SET FEATURE command 410 is illustrated as D5h. However, the particular command code is provided by way of example, and not intended to limit the invention to any particular command code. At time T1, a logical unit (LUN) identification number 420 is received by the memory to identify a particular LUN for which the second read mode is enabled. In some embodiments where there are not multiple LUNs, the LUN identification may not be needed. At time T2, a feature address 430 corresponding to the second read mode is received by the memory. In the example of FIG. 4, the feature address 430 corresponding to the second read mode is shown as F5h. However, the particular feature address is provided by way of example, and other feature addresses may be designated for the different read modes.

At time T3, subfeature parameters 440A, 440B, 440C, and 440D are received by the memory in sequence. The subfeature parameters 440 may be used in some embodiments to enable particular options associated with the feature being enabled by the SET FEATURE command 410. In the example illustrated by FIG. 4, no particular options are associated by the second read mode, and the subfeature parameters 440 received by the memory are subfeature parameter 440A, P1=00h; subfeature parameter 440B, P2=00h; subfeature parameter 440C, P3=00h; and subfeature parameter 440D, P4=00h. The particular subfeature parameters are provided by way of example, and other subfeature parameters may be designated for different options, if available.

Following the sequence of subfeature parameters 440A-440D, the memory performs internal operations to enable the second read mode during a time period 450 between times T4 and T5, shown in FIG. 4 as time period tFEAT. After the set feature operation is complete, the memory will initiate a read operation for the second read mode responsive to receiving a read command.

As previously discussed, a read operation for a read mode, such as the second read mode discussed with reference to FIG. 3, may include various sub-operations that may be selectively enabled or disabled. For example, with reference to the second read mode, calculation of temperature compensation information prior to receiving a read command may be disabled, resulting in the calculation of the temperature compensation information during time period P1. Another example, also with reference to the second read mode, is disabling the provision of read data following the time period P6. As a result, data may not be provided until after circuits and signal lines used during the read operation are returned to an initial condition during time period P7.

In some embodiments, the various sub-operations of a read operation for a read mode may be selectively enabled or disabled as a subfeature associated with a feature. As previously discussed, subfeatures associated with a feature may be enabled by subfeature parameters that may be received during a set feature operation, such as the set feature operation illustrated and described with reference to FIG. 4. For example, in an embodiment where the sub-operation of calculating the temperature compensation information prior to receiving a read command may be disabled, control over the sub-operation may be associated with the subfeature parameter 440A, and the temperature compensation calculation sub-operation may be disabled with a subfeature parameter 440A, P1=01h, in contrast to a subfeature parameter P1=00h. The temperature compensation information calculation sub-operation and the particular use of subfeature parameter 440A is provided by way of example. The temperature compensation information calculation sub-operation, as well as other sub-operations of a read operation may be treated as subfeatures of a read mode, and coded differently than previously described.

After a read mode has been enabled, the read mode may be disabled. In some embodiments, a read mode may be disabled when another read mode is enabled, for example, by using a set feature operation. A set feature operation may be performed to enable the first read mode in order to disable the second read mode, which switches the memory from operating according to the second read mode to operating to the first read mode responsive to a read command.

In other embodiments, a read mode may be disabled in a different manner. For example, a read mode may be disabled by a test mode setting, a trim setting, a disable command, or using another manner.

In some embodiments, the first read mode may be a default read mode for a memory, and the second read mode may be enabled using a set feature operation, as previously described. The second read mode may be disabled in order to return to the default first read mode. The second read mode may be disabled based on a memory command or commands. For example, a read mode may be disabled and the memory returned to a default read mode when the memory receives a program command, an erase command, a deep sleep command, a reset command, or other command.

Figure 5:
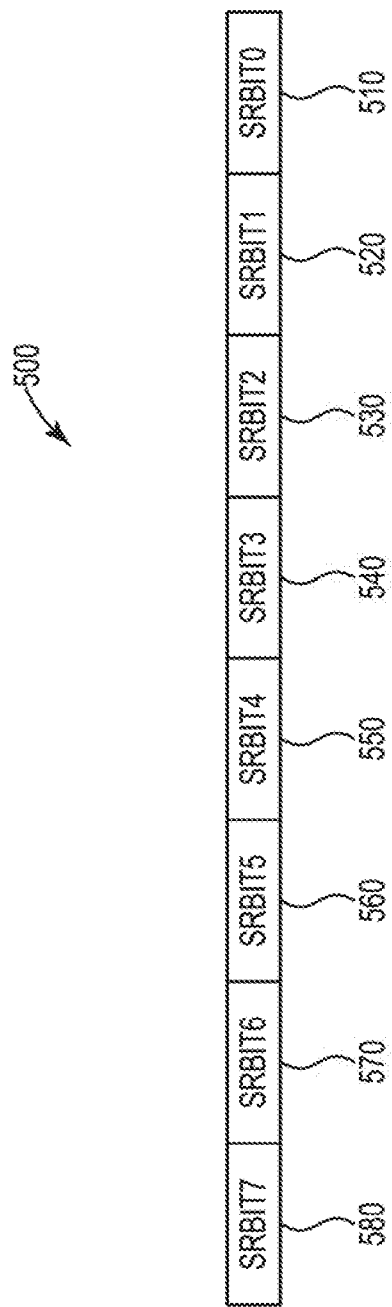
FIG. 5 is a diagram of a status register according to an embodiment of the invention.

FIG. 5 illustrates a status register 500 according to an embodiment of the invention. The status register 500 may be used for the status register 134 of FIG. 1A.

The status register includes eight status bits SRBIT0-SRBIT7. Each of the status bits may represent a respective status of a condition of the memory, for example. The status bits may be provided by the memory responsive to a read status command. The status register 500 may include a first status bit having a value to indicate whether the memory is ready to another memory command. The status register 500 may further include a second status bit having a value to indicate whether the memory is ready to provide read data from a read operation. In the embodiment of FIG. 5, the first status bit corresponds to SRBIT5 and the second status bit corresponds to SRBIT6.

The first status bit SRBIT5 may have a "0" value to indicate that the memory is busy and is not ready to receive a new memory command. When the memory is ready to receive a new memory command, the first status bit SRBIT5 may be changed to have a "1" value. The second status bit SRBIT6 may have a "0" value to indicate that the memory is busy and read data for a previous read command is not ready to be provided (e.g., the read operation has not yet completed). When the memory is ready to provide read data from the previous read command, the second status bit SRBIT6 may be changed to have a "1" value. In some embodiments, the memory may nonetheless receive particular memory commands while the memory is busy, for example, reset, or read status.

In operation, a read status command may be received by the memory and the status bits may be provided to indicate the status of whether read data for a read operation is ready to be provided and the status of whether a new memory command may be provided to the memory.

For example, responsive to a read status command is receive at a time after a read command is received, the memory may provide the status bits including the status bits SRBIT5 and SRBIT6 both having a "0" value to indicate the read data is not ready to be provided and the memory is not ready to receive a new memory command. This status condition may exist during the read operation, for example, between times T0 and T6 for the read operations of the first and second read modes previously discussed with reference to FIGS. 2 and 3.

The memory may provide the status bits responsive to a read status command that include the status bit SRBIT6 having a "1" value and the SRBIT5 having a "0" value to indicate that read data is ready to be provided by the memory, but the memory is not ready to receive a new memory command. This status condition may exist during a read operation for a read mode, for example, the second read mode, between times T6 and T7, with reference to FIG. 3. The read data may be made available following the time T6, but the memory is not ready to receive a new memory command because various circuits and signal lines used during the read operation are in the process of being returned to an initial condition in preparation for a new memory command.

Responsive to a read status command, the memory may provide the status bits including the status bits SRBIT5 and SRBIT6 both having a "1" value to indicate the read data is ready to be provided and the memory is ready to receive a new memory command. This status condition may exist following a read operation, for example, following time T7 for the read operations of the first and second read modes previously discussed with reference to FIGS. 2 and 3. Following the time T7, read data from a read operation is ready to be provided, and the memory is ready for a new command because the process of returning various circuits and signal lines used during the read operation to an initial condition has completed.

It will be appreciated that the particular details provided with reference to FIG. 5 are provided by way of example, and that in other embodiments the particular status bits, the particular values, and the operation for reading the values of the status bits from the status register may be different than that previously described.

Figure 6:
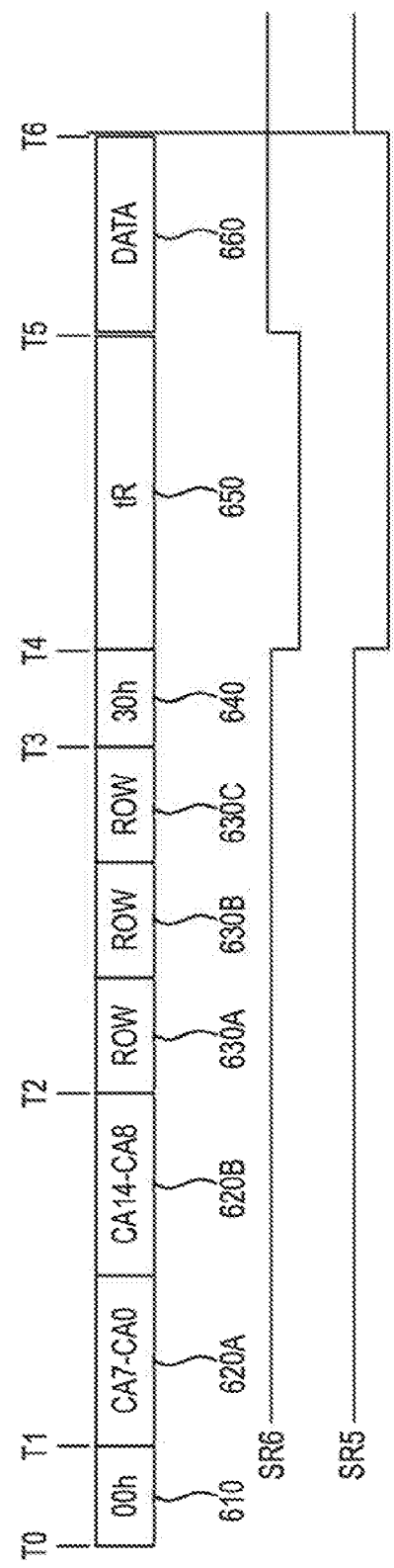
FIG. 6 is a sequence of a read command and the associated read operation for the second read mode according to an embodiment of the invention.

FIG. 6 illustrates a sequence 600 of a read command and the associated read operation for the second read mode according to an embodiment of the invention.

At time T0, a read command 610 is received by the memory. In the embodiment of FIG. 6, the read command 610 is illustrated as 00h. However, the particular command code is provided by way of example, and not intended to limit the invention to any particular command code. At time T1, column address information 620A and 620B are sequentially received by the memory. The column address information 620A and 620B are used to identify the location of the memory to be accessed during the read operation. At time T2, row address information 630A, 630B, and 630C are sequentially received by the memory. The row address information 630A, 630B, and 630C are used to further identify the location of the memory to be accessed by the read operation. In the embodiment of FIG. 6, the number of column and row address information, and the sequence of receiving the column and row address information by the memory is provided by way of example. Other embodiments may have a different number of column and row address information, and may be received in a different sequence.

At time T3, a read page command 640 is received by the memory. In the embodiment of FIG. 6, the read page command 640 is illustrated as 30h. However, the particular command code is provided by way of example, and not intended to limit the invention to any particular command code. The read page command 640 causes the memory to initiate a read operation directed to the memory identified by the column and row address information 620A, 620B, 630A, 630B, and 630C. At time T4, the memory begins the read operation, which occurs over the time period 650 shown in FIG. 6 as tR. As indicated by "0" value of the status bits SRBIT5 and SRBIT6 between times T4 and T5, the memory is not ready to receive a new memory command, nor is read data ready to be provided. During the times T4 and T5, the read operation is performed, for example, as previously described for the second read mode.

At time T5, the memory is ready to provide the read data from the read operation, and the status bit SRBIT6 is changed to a "1" value. As previously discussed, the status bits may be provided by the memory responsive to a read status command to indicate that the read data is ready to be provided. The status bit SRBIT5, however, continues to have a "0" value to indicate that the memory is still not ready to receive a new memory command. As previously discussed, the memory may not be ready to receive a new command as the circuits and signal lines used during the read operation are in the process of being returned to an initial condition.

Following the time T5, the read data 660 is shown in FIG. 6 as being provided by the memory. At time T6, the status bit SRBIT5 changes to a "1" value to indicate that the memory is ready to receive a new memory command. The status bit SRBIT5 changes to a "1" value when the circuits and signal lines of the memory are ready to begin another memory operation responsive to a new memory command. Thus, the status bits provided by the memory responsive to a read status command will indicate that the memory is ready to receive a new memory command.

From the foregoing it will be appreciated that, although specific embodiments of the invention have been described herein for purposes of illustration, various modifications may be made without deviating from the spirit and scope of the invention. Accordingly, the invention is not limited to the specific embodiments of the invention described herein.

What is claimed is:

1. An apparatus, comprising:
a memory including a first read mode and a second read mode, wherein a read operation for either the first read mode or the second read mode is performed responsive to the memory receiving a read command, the read operation for the first read mode includes a first pre-access phase while the read operation for the second read mode includes a second pre-access phase and wherein the second pre-access phase is different from the first pre-access phase, the second pre-access phase having a shorter time than the first pre-access phase relative to receipt of the read command, and the second pre-access phase includes development of a full pumped voltage from a ready pumped voltage.

2. The apparatus of claim 1 wherein a first read operation for the first read mode includes the first pre-access phase, a first access phase, and a first post-access phase, and wherein a second read operation for the second read mode includes the second pre-access phase, a second access phase, and a second post-access phase.

3. The apparatus of claim 2 wherein the first pre-access phase includes activation of one or more charge pump circuits configured to provide a pumped voltage used during the first read operation for the first read mode and further includes calculation of temperature compensation information for the first read operation for the first read mode.

4. The apparatus of claim 1 wherein the first read mode corresponds to a default read mode for the memory, and wherein the second read mode corresponds to a set feature operation mode.

5. The apparatus of claim 4 wherein, during the second pre-access phase of the set feature operation mode a set feature operation is received, wherein the set feature operation includes a set feature command to enable a feature, wherein the feature includes subfeatures, each subfeature having corresponding subfeature parameters.

6. The apparatus of claim 5 wherein a subfeature of the subfeatures includes a sub-operation of calculation of temperature compensation information, and wherein a corresponding subfeature parameter corresponds to a control parameter that disables the subfeature.

7. The apparatus of claim 5 wherein the set feature command comprises a feature address and a logical unit identification number (LUN) that identifies the LUN for which the set feature operation is enabled.

8. The apparatus of claim 4 wherein the second read mode is disabled, responsive to a memory command, to return the memory to the first read mode.

9. The apparatus of claim 8 wherein the memory command corresponds to at least one of a program command, an erase command, a deep sleep command, a reset command, or other command.

10. An apparatus, comprising:
an input-output control circuit;
a memory array including a plurality of memory cells that are configured to store data, the memory array further including global and local signal lines for accessing the memory cells;
control logic coupled to the input-output control circuit and the memory array, the control logic configured to provide, in a first mode, internal control signals responsive to receiving a read command that controls activation of a charge pump circuit to develop a full pumped voltage prior to driving global signal lines to a target global signal line voltage based on the full pumped voltage, and
wherein the control logic is configured to provide, in a second mode, internal control signals prior to receiving a read command that controls the charge pump circuit to develop a ready pumped voltage that is less than the full pumped voltage and further configured to provide internal control signals responsive to receiving the second read command to control the charge pump circuit to develop the ready pumped voltage prior to driving the global signal lines to the target global signal voltage based on the full pumped voltage.

11. The apparatus of claim 10 wherein the control logic is further configured to provide internal control signals to calculate temperature compensation information in the first read mode, responsive to receiving the read command that controls activation of the charge pump circuit to develop the full pumped voltage.

12. The apparatus of claim 11 wherein the temperature compensation is based on a temperature measurement from a temperature sensor of the memory array.

13. The apparatus of claim 10 wherein the control logic is further configured to provide internal control signals to calculate temperature compensation information in the second read mode prior to receiving the read command that controls the charge pump circuit to develop the ready pumped voltage, and further configured to provide internal control signals to update the temperature compensation information based on a temperature measured at a time after receiving the read command that controls the charge pump circuit to develop the ready pumped voltage.

14. The apparatus of claim 13, wherein the control logic further configured to provide internal control signals responsive to calculation of the temperature compensation information to store the temperature compensation information, and wherein the control logic further configured to provide internal control signals responsive to receiving a read command that accesses the temperature compensation information that was stored.

15. The apparatus of claim 13 wherein the temperature compensation information corresponds to temperature coefficients that adjust voltage levels of the memory array during a read operation responsive to the second read command.

16. The apparatus of claim 13 wherein a calculation of the temperature compensation information prior to receiving the read command that controls the charge pump circuit to develop the ready pumped voltage takes less time than a calculation of the temperature compensation information responsive to the receiving the read command that controls activation of the charge pump circuit to develop the full pumped voltage.

17. A method, comprising:
providing first control signals for reading first data from a memory array in a first mode; and
providing first control signals for reading first data from a memory array in a first mode; and providing second control signals for reading second data from the memory array in a second mode, the second control signals including a control signal that charges a pump voltage to a different voltage than a pump voltage utilized in the first mode, wherein the second data is available sooner following completion of operation for accessing the memory array in the second mode in comparison to when the first data is available following completion of operations for accessing the memory array in the first mode.

18. The method of claim 17, further comprising using a same sequence of operations for accessing the memory array for the first mode and the second mode.

19. The method of claim 17, further comprising restoring at least one circuit used when reading the second data from memory to an initial condition after completion of the operation for accessing the memory array in the second mode.

20. The method of claim 19, wherein restoring the at least on circuit used when reading the second data from memory to the initial condition comprises:
  maintaining activation of at least one charge pump circuit to develop respective ready pumped voltages in preparation for a read operation in the second mode; and
  precharging at least one signal line of the memory array to a ready signal line voltage.

\* \* \* \* \*

UNITED STATES PATENT AND TRADEMARK OFFICE
CERTIFICATE OF CORRECTION

PATENT NO. : 9,858,971 B2
APPLICATION NO. : 15/439507
DATED : January 2, 2018
INVENTOR(S) : Theodore T. Pekny Page 1 of 1

It is certified that error appears in the above-identified patent and that said Letters Patent is hereby corrected as shown below:

| | Reads | Should Read |
|---|---|---|
| Column 1, Line 7 | "This application is a continuation of pending U.S." | --This application is a continuation of U.S.-- |
| Column 14, Line 53-54 | "providing first control signals for reading first data from a memory array in a first mode; and providing second" | --providing second-- |
| Column 14, Line 60 | "completion of operation" | --completion of operations-- |

Signed and Sealed this
Twenty-ninth Day of May, 2018

Andrei Iancu
*Director of the United States Patent and Trademark Office*